(12) United States Patent
Wajata

(10) Patent No.: US 8,324,918 B2
(45) Date of Patent: Dec. 4, 2012

(54) PROBE NEEDLE MATERIAL, PROBE NEEDLE AND PROBE CARD EACH USING THE SAME, AND INSPECTION PROCESS

(75) Inventor: Takayuki Wajata, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 273 days.

(21) Appl. No.: 12/680,124

(22) PCT Filed: Aug. 29, 2008

(86) PCT No.: PCT/JP2008/002365
§ 371 (c)(1),
(2), (4) Date: Mar. 25, 2010

(87) PCT Pub. No.: WO2009/040986
PCT Pub. Date: Apr. 2, 2009

(65) Prior Publication Data
US 2010/0194415 A1    Aug. 5, 2010

(30) Foreign Application Priority Data
Sep. 27, 2007   (JP) .................................. 2007-251670

(51) Int. Cl.
*G01R 31/20*   (2006.01)
*G01R 1/067*   (2006.01)

(52) U.S. Cl. ................ 324/754.01; 324/755.01
(58) Field of Classification Search .. 324/754.01–754.3, 324/755.01–755.11, 762.01–762.1; 438/14–18; 257/48

See application file for complete search history.

(56) References Cited

U.S. PATENT DOCUMENTS

| | | | | |
|---|---|---|---|---|
| 5,280,236 A | * | 1/1994 | Takahashi et al. | ....... 324/755.01 |
| 6,121,784 A | * | 9/2000 | Montoya | .................. 324/756.03 |

FOREIGN PATENT DOCUMENTS

| | | |
|---|---|---|
| JP | 2002-005958 A | 1/2002 |
| JP | 2002-356732 A | 12/2002 |
| JP | 2003-023050 A | 1/2003 |
| JP | 2005-106690 A | 4/2005 |
| JP | 2006-102775 A | 4/2006 |

* cited by examiner

Primary Examiner — Tung X Nguyen
(74) Attorney, Agent, or Firm — Foley & Lardner LLP

(57) ABSTRACT

Disclosed is a probe needle material used for producing a probe needle which is used in contact with an inspection object to inspect electrical characteristics of the inspection object, comprising not less than 0.1% by volume but not more than 3.5% by volume of at least one compound selected from the group consisting of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide and the balance of a tungsten alloy mainly consisting of tungsten.

6 Claims, 6 Drawing Sheets

PRIOR ART

Heat treatment temp. (°C) × 5 minute maintenance

Heat treatment temp. (°C) × 5 minute maintenance

PROBE NEEDLE MATERIAL, PROBE NEEDLE AND PROBE CARD EACH USING THE SAME, AND INSPECTION PROCESS

TECHNICAL FIELD

The present invention relates to a probe needle material for producing a probe needle which is used to inspect electrical characteristics of an inspection object, a probe needle and probe card using the same, and an inspection process using the probe card.

BACKGROUND ART

In an electric test (hereinafter referred to as the wafer test) in a wafer test process for semiconductor integrated circuits, a probe card having a probe needle, which is made of a tungsten base material fabricated to have a needle shape with a diameter of, for example, 200 to 300 μm, is used. And the probe needle of the probe card is contacted to the electrode of the semiconductor integrated circuit to perform the wafer test. The probe needle mainly consisting of the tungsten base material is used, and doped tungsten containing aluminum, potassium, silicon or the like, or rhenium-tungsten containing about 3% by mass of rhenium having high strength and high hardness is generally used.

But, when the above-described probe needle consisting of the tungsten base material is repeatedly contacted to the electrodes in the wafer test, the electrode material such as Al or Al—Cu adheres to its tip, and it finally becomes impossible to perform the normal wafer test. Specifically, a small current is passed when the probe needle is contacted to the electrodes in the wafer test, but an electric current density becomes large because the tip of the probe needle has a small diameter, and the tip of the probe needle has a temperature region to melt the electrode material. And, the melted electrode material adheres to the probe needle and it is oxidized to increase the contact resistance, making the normal wafer test difficult.

Therefore, it is general to remove the electrode material adhered to the tip of the probe needle by polishing so as to reduce the contact resistance, and the probe needle is reused for the wafer test. Since the above method cannot fully remove the electrode material which has entered between tungsten crystals and the electrode material tends to adhere in the early stage, it is determined to use the probe needle made of a tungsten alloy containing, for example, 0.1 to 1.0% by mass of a metal selected from Y, La and Ce or its oxide (for example, see Patent Reference 1).

Patent Reference 1: JP-A 2003-023050 (KOKAI)

DISCLOSURE OF THE INVENTION

A probe needle used for the wafer test recovers a good contact when the electrode material adhered to the tip is removed by polishing, but the electrode material tends to adhere in the early stage, and the tip also tends to be abraded. Therefore, the exchange of the probe card is finally needed, and it costs high. A metal selected from Y, La and Ce or its oxide is contained to maintain a good contact, but such a method does not necessarily maintain a good contact for a long period.

The present invention provides a probe needle material which can be used to produce a probe needle capable of maintaining contact stability for a long period and not abraded heavily by polishing. The invention also provides a probe needle and a probe card using the above probe needle material. The invention also provides an inspection process using the above probe card.

A probe needle material of the invention used for producing a probe needle which is used in contact with an inspection object to inspect electrical characteristics of the inspection object comprises not less than 0.1% by volume but not more than 3.5% by volume of at least one compound selected from the group consisting of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide and the balance of a tungsten alloy mainly consisting of tungsten.

A probe needle of the invention is used in contact with an inspection object to inspect electrical characteristics of the inspection object, wherein the probe needle material of the invention is disposed on at least the tip portion of the probe needle.

A probe card of the invention comprises a probe card body and a probe needle, used to inspect electrical characteristics of an inspection object by contacting the probe needle to the inspection object, wherein the probe needle is the probe needle according to the invention described above.

An inspection process of the invention comprises using a probe card having a probe card body and a probe needle and contacting the probe needle to an inspection object to inspect electrical characteristics of the inspection object, wherein the probe card according to the invention described above is used as the probe card.

DESCRIPTION OF NUMERALS

Figure 1:
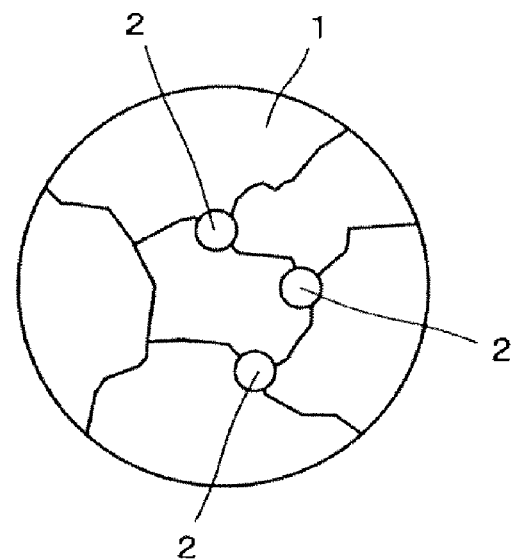
FIG. 1 is a schematic diagram schematically showing an example of a microstructure of the probe needle material of the invention.

1 . . . matrix, 2 . . . microscopic particles made of hard-to-adhere compound, 10 . . . probe needle, 10a . . . base end portion, 10b . . . buckling portion, 10c . . . tip portion, 20 . . . probe needle, 20a . . . base end portion, 20b . . . bent portion, 20c . . . tip portion, 100 . . . probe card, 110 . . . substrate, 120 . . . probe needle supporting portion, 121, 122 . . . support plates, 123 . . . suspending member, 130 . . . wiring pattern, 131 . . . substrate terminal, 200 . . . probe card, 210 . . . substrate, 210a . . . opening portion, 211 . . . ring, 212 . . . through hole, 213 . . . wiring pattern, 214 . . . substrate terminal, 300 . . . semiconductor integrated circuit, 301 . . . electrode

BEST MODE FOR CARRYING OUT THE INVENTION

The present invention is described below in detail. The probe needle material of the present invention is used to produce a probe needle which is used to inspect electrical characteristics of an inspection object in contact with the inspection object and contains not less than by volume but not more than 3.5% by volume of at least one compound elected from the group consisting of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide and the balance of a tungsten alloy mainly consisting of tungsten.

A tungsten base material is conventionally used as a probe needle because it has low electric resistivity, high strength and high hardness. But ease of adhesion of an electrode material configuring the electrode to be inspected, especially Al or the like, has not been studied. Specifically, a small current is passed when the probe needle is contacted to the electrode in the wafer test, but an electric current density is large to several hundreds A/mm$^2$ because the tip of the probe needle has a small diameter of, for example, several tens of micrometers, and the tip of the probe needle has a temperature region to melt the electrode material. And, the melted electrode material adheres to the probe needle and it is also oxidized to increase the contact resistance, and the normal wafer test is made difficult.

The present invention contains a substance, to which the electrode material, especially Al or the like, does not adhere easily, namely a compound having poor wettability, into the probe needle material, so that when the probe needle material is used as the probe needle for the wafer test, the electrode material is suppressed from adhering, and the contact resistance can be suppressed from increasing as a result. The present invention has a feature that there is used, as the compound which is hard to adhere to the electrode material, at least one compound selected from the group consisting of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide. In the following description, it is determined to collectively call the above-described titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide as the hard-to-adhere compound.

Table 1 shows the results of measuring contact angle θ of Al as the electrode material to evaluate the wettability of the hard-to-adhere compound. For comparison, Table 1 also shows the results measured by using only tungsten without containing the hard-to-adhere compound. The contact angle θ was measured at room temperature by contacting the molten material of Al heated to 800° C. to the surface of a plate-like test material made of the hard-to-adhere compound or tungsten. Since Al easily forms an oxide film in the atmosphere, measurement was performed in an Ar atmosphere. For reference, the melting points of the hard-to-adhere compound and tungsten are also shown.

TABLE 1

| Test material | Contact angle θ (°) | Melting point (° C.) |
|---|---|---|
| TiB$_2$ | 98 | 2790 |
| ZrB$_2$ | 106 | 3200 |
| HfB$_2$ | 134 | 3250 |
| NbB$_2$ | 125 | 3000 |
| TaB$_2$ | 138 | 3037 |
| CrB$_2$ | 96 | 2200 |
| TiC | 149 | 3257 |
| ZrC | 151 | 3530 |
| HfC | 148 | 3890 |
| VC | 130 | 2648 |
| NbC | 136 | 3613 |
| TaC | 145 | 3985 |
| ZrO$_2$ | 117 | 2715 |
| HfO$_2$ | 137 | 2758 |
| Cr$_2$O$_3$ | 120 | 2300 |
| W | 75 | 3410 |

It is apparent from Table 1 that the hard-to-adhere compound used in the invention has Al wettability lower than that of tungsten and Al does not adhere easily because tungsten has a contact angle of 75 degrees while the hard-to-adhere compound used in the present invention has a contact angle of about 100 degrees or more.

Figure 2:
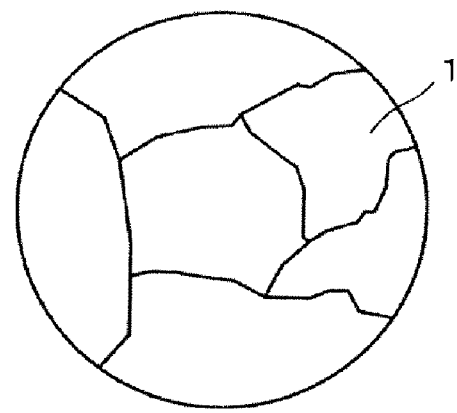
FIG. 2 is a schematic diagram schematically showing an example of a microstructure of a conventional probe needle material.

FIG. 1 shows an example of a microstructure of the probe needle material of the invention. FIG. 2 shows an example of a microstructure of a conventional probe needle material, showing an example of the microstructure of AKS doped tungsten, rhenium-tungsten or the like.

As shown in FIG. 1, the probe needle material of the invention contains, in a matrix 1 mainly consisting of tungsten, the hard-to-adhere compound as microscopic particles 2 in a dispersed form which is at least one compound selected from the group consisting of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide. The tungsten alloy configuring the probe needle material of the invention is also called as the dispersion strengthened alloy because the hard-to-adhere compound is contained in a particulate and dispersed state in the matrix 1. Specifically, the microscopic particles 2 are contained in the dispersed form in the proximity of the grain boundary of crystal particles configuring the matrix 1.

Meanwhile, the conventional probe needle material does not contain the microscopic particles 2 made of the hard-to-adhere compound as shown in FIG. 2 but has, for example, rhenium, cobalt or the like (not shown) dissolved into the matrix 1 mainly consisting of tungsten, and it is also called as a solid solution strengthened alloy. The matrix 1 of the probe needle material of the invention may also have rhenium or cobalt dissolved therein.

The probe needle material of the invention has the hard-to-adhere compound contained as the microscopic particles 2 in the dispersed form in the matrix 1, so that adhesion of the electrode material can be suppressed at a portion where at least the microscopic particles 2 are present. And, the hard-to-adhere compound is contained as the microscopic particles 2 in the dispersed form in the matrix 1, namely the hard-to-adhere compound is not dissolved into the matrix 1, so that the conductor resistance of the probe needle obtained can be suppressed from increasing. Thus, since the conductor resistance is suppressed from increasing, it also becomes possible to pass an electric current quickly at the time of the wafer test.

In addition, the hard-to-adhere compound contained in the probe needle material of the invention is boride, carbide or oxide, and since it is very hard like ceramics, the crystalline structure of the matrix 1 mainly consisting of tungsten can be miniaturized and the hardness of the probe needle material can be enhanced. As a result, when the electrode material adhered to the tip of the probe needle is removed by polishing, the abrasion of the tip can be suppressed effectively.

It is preferable that the microscopic particles 2 of the hard-to-adhere compound have an average particle diameter of, for example, not less than 0.1 µm but not more than 8.0 µm. If the average particle diameter of the microscopic particles 2 is less than 0.1 µm, the microscopic particles 2 are too small to provide a sufficient effect of suppressing the adhesion of the electrode material, and if the average particle diameter of the microscopic particles 2 exceeds 8.0 µm, it might become hard to provide a small diameter by a wire drawing process which is performed to provide the probe needle.

The average particle diameter of the microscopic particles 2 is determined by, for example, two-dimensional image analysis of a cross section of the probe needle material. Specifically, 200 microscopic particles 2 are evaluated for their areas, a diameter of a circle having the same area as above is approximated to the diameters of the microscopic particles 2, and their average is determined as the average particle diameter.

In the whole probe needle material, namely a total of the matrix 1 mainly consisting of tungsten and the microscopic particles 2 made of the hard-to-adhere compound, the hard-to-adhere compound content is not less than 0.1% by volume but not more than 3.5% by volume, preferably not less than 0.5% by volume but not more than 2% by volume, and more preferably not less than 1.0% by volume but not more than 2% by volume.

If the hard-to-adhere compound content is less than 0.1% by volume, the adhesion of the electrode material to the produced probe needle cannot be suppressed sufficiently, and when the adhered electrode material is removed by polishing, abrasion is caused easily because hardness is not sufficient either. The hard-to-adhere compound content is preferably large to, for example, not less than 0.5% by volume, and more preferably not less than 1.0% by volume, from the viewpoints of suppression of the adhesion of the electrode material and the abrasion due to polishing when the probe needle is used.

When the hard-to-adhere compound content is increased as described above, the adhesion of the electrode material when the probe needle is used can be reduced, and the abrasion can also be reduced when the adhered electrode material is removed by polishing, but if the hard-to-adhere compound content exceeds 3.5% by volume, it becomes particularly difficult to perform a wire drawing process for fabricating into the probe needle having a wire diameter of not more than 0.3 mm, and further a wire diameter of not more than 0.1 mm. It is because the hard-to-adhere compound is harder than tungsten and tends to become an origin of disconnection or a crack, the addition of the hard-to-adhere compound miniaturizes the structure of the matrix 1, and considerable force must be applied at the time of wire drawing out. Therefore, the hard-to-adhere compound content is preferably determined to be not more than 3.5% by volume in the entire probe needle material.

As the hard-to-adhere compound, only one or two more of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide may be contained. And when two or more of them are contained, it is appropriate if their total amount is not less than 0.1% by volume but not more than 3.5% by volume in the whole probe needle material.

The hard-to-adhere compound content is defined by a volume percentage because of the following reason. Specifically, it is apparent from the above that the contact area between the electrode material and the hard-to-adhere compound is significant in order to suppress the adhesion of the electrode material. In addition, since the individual hard-to-adhere compounds have a different specific gravity, their volumes and surface areas become different even if they are added in the same mass. Therefore, the present invention defines the hard-to-adhere compound content by the volume percentage so that the contact area with the electrode material does not become different depending on the kinds of the hard-to-adhere compounds.

Here, the hard-to-adhere compound content (volume percentage [%]) in the probe needle material can be determined as follows. Specifically, it can be determined by calculating the mass fraction of the hard-to-adhere compound by analyzing the probe needle material by a wet process and converting the obtained result into the volume percentage by using a specific gravity. The portion to be analyzed is a part of the material which can be checked as having the same composition as that of the tip portion of the probe needle by observing by EPMA, XRD or the like. For simplicity, a polished surface obtained by cutting and polishing the probe needle material is identified for the hard-to-adhere compound (microscopic particles 2) by EPMA, XRD or the like, and the volume percentage [%] of the hard-to-adhere compound may be determined by an area ratio (area of hard-to-adhere compound/total area× 100[%]) between an area of the identified hard-to-adhere compound (microscopic particles 2) and a total area (a total of the area of the hard-to-adhere compound (microscopic particles 2) and the area of the other part (matrix 1)). The probe needle to be described later can also be determined similarly for the volume percentage [%] of the hard-to-adhere compound.

A portion other than the hard-to-adhere compound (microscopic particles 2) of the probe needle material of the invention, namely the matrix 1, mainly consists of tungsten. Here, "mainly consists of tungsten" means that it is appropriate when not less than 50% by mass of at least tungsten is contained, and less than 50% by mass of another alloy element may be contained other than the matrix 1 consisting of tungsten only.

The matrix 1 preferably contains not more than 44% by mass of rhenium. The matrix 1 which mainly configures the probe needle material is determined to contain not more than 44% by mass of rhenium, so that a sharp drop in the tensile strength due to the heat treatment at a high temperature can be suppressed, and the probe needle material can be made excellent in wire drawing processability when it is made into the probe needle.

Figure 3:
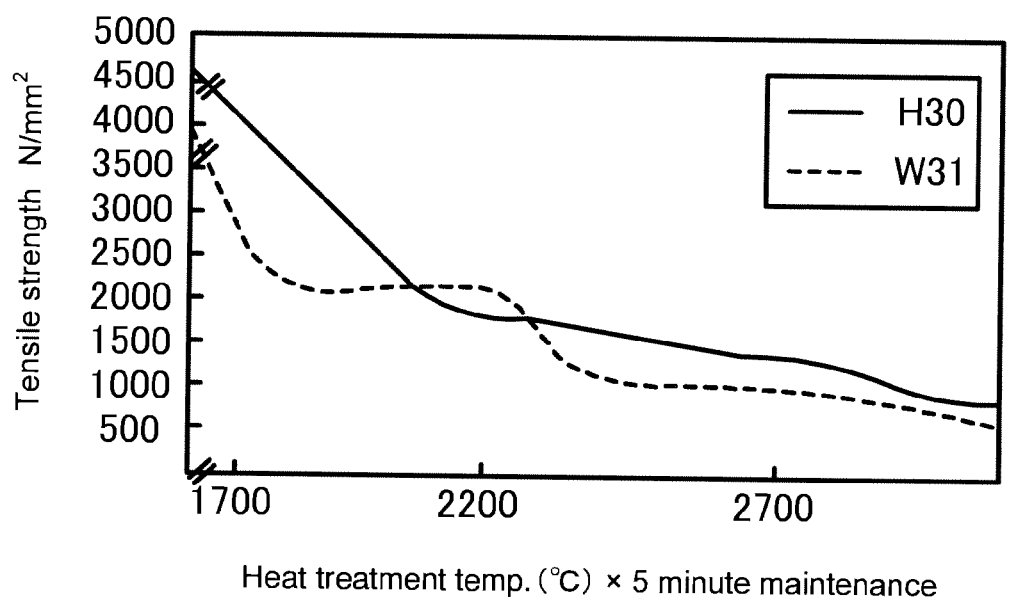
FIG. 3 is a diagram showing a relationship between a heat treatment temperature and tensile strength of a rhenium-tungsten material (H30) containing rhenium as well as a tungsten material (W31) not containing rhenium.

FIG. 3 compares a tensile strength between rhenium-tungsten (H30) containing 3% by mass of rhenium and ordinary doped tungsten (W31) not containing rhenium after performing a heat treatment at a predetermined temperature for five minutes. Both rhenium-tungsten (H30) and doped tungsten (W31) contain aluminum, silicon and potassium as doping agents, and the purity of tungsten in the rhenium-tungsten (H30) excluding rhenium and the purity of tungsten in the doped tungsten (W31) are not less than 99.95% by mass.

It is seen as shown in FIG. 3 that the doped tungsten (W31) not containing rhenium is secondary-recrystallized by the heat treatment at a high temperature exceeding 2300° C., and the tensile strength drops sharply, while the rhenium-tungsten (H30) containing 3% by mass of rhenium is suppressed from having a sharp drop in the tensile strength even by the heat treatment at a high temperature exceeding 2300° C.

Thus, since the rhenium-tungsten containing the rhenium can keep the tensile strength even after the high temperature heat treatment, the wire drawing processability is excellent when the probe needle is produced, and it becomes possible to produce a small-diameter probe needle having, for example, a wire diameter of about 0.08 mm. The rhenium content in the matrix 1 excluding the hard-to-adhere compound is not necessarily restricted, but it is preferably at least not less than 1% by mass from the viewpoint of obtaining the above effects.

Figure 4:
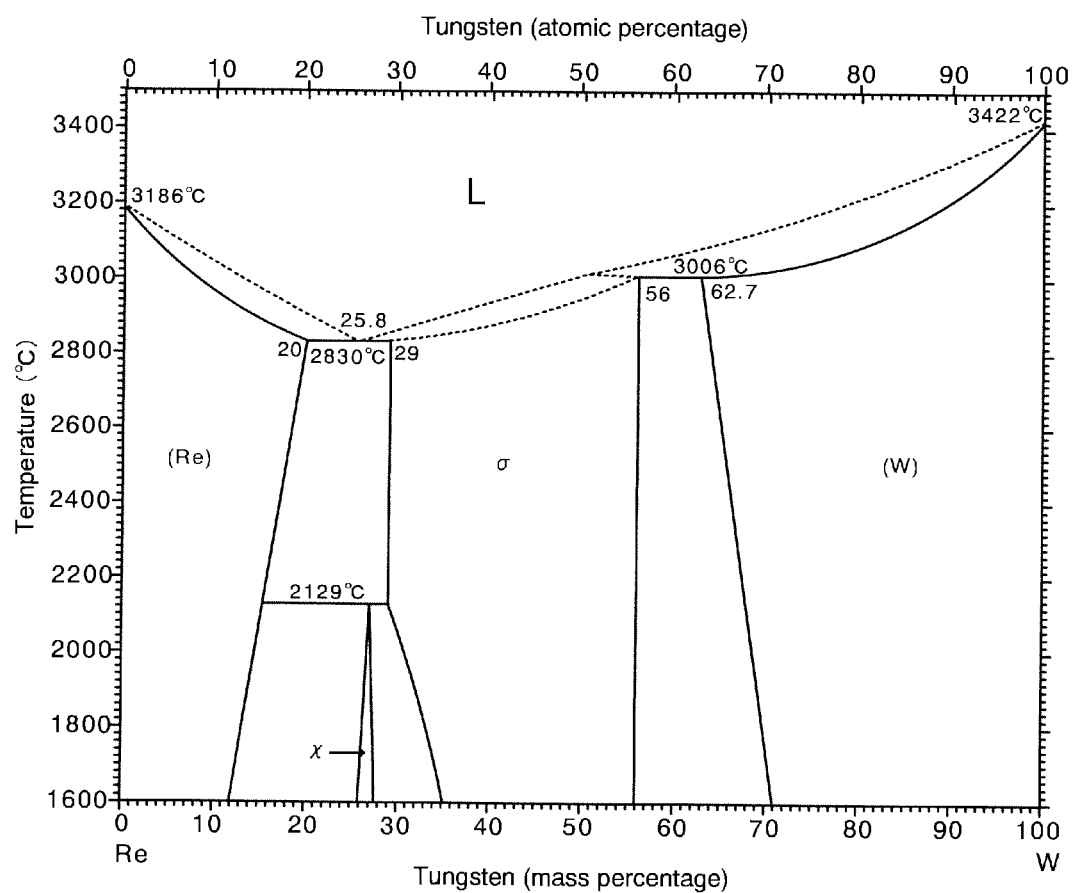
FIG. 4 is a diagram of a two-phase state of rhenium-tungsten.

Meanwhile, FIG. 4 shows a diagram of a two-phase state of the rhenium-tungsten. As shown in FIG. 4, if the rhenium content exceeds 44% by mass, a very hard and brittle hard-to-fabricate layer which is called as σ layer is precipitated, and a crack is easily caused at the time of the wire drawing process to produce the probe needle. Therefore, the rhenium content in the matrix 1 excluding the hard-to-adhere compound is preferably not more than 44% by mass. The rhenium content is more preferably not more than 29% by mass from the viewpoint of the wire drawing processability.

The matrix 1 preferably contains not more than 500 mass ppm of cobalt. Since the matrix 1 which mainly configures the probe needle material is determined to contain not more than 500 mass ppm of cobalt, a sharp drop in tensile strength by the high temperature heat treatment can be suppressed, and the wire drawing processability at the time of producing the probe needle can be made excellent.

Figure 5:
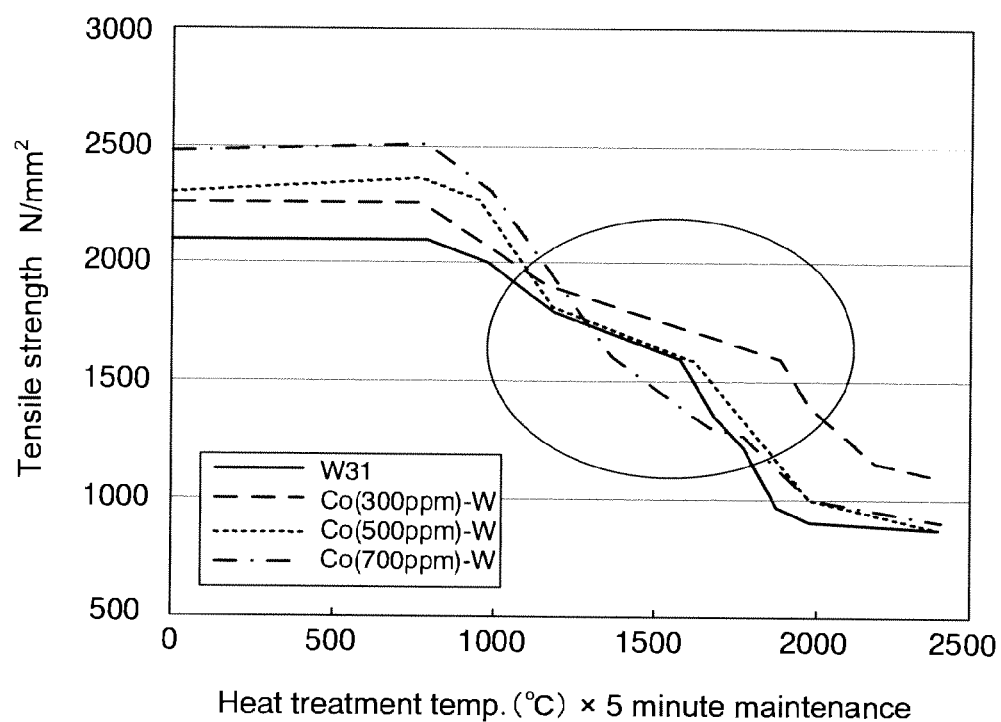
FIG. 5 is a diagram showing a relationship between a heat treatment temperature and tensile strength of a tungsten material containing cobalt as well as a tungsten material (W31) not containing cobalt.

FIG. 5 shows the results of measuring a tensile strength of a thin wire having a diameter of 0.39 mm made of a tungsten alloy (300 mass ppm Co—W, 500 mass ppm Co—W, 700 mass ppm Co—W) containing cobalt and ordinary doped tungsten (W31) not containing cobalt after holding at a prescribed heat treatment temperature for five minutes.

As described above, the tungsten alloy containing cobalt contains cobalt in 300 mass ppm, 500 mass ppm or 700 mass ppm, and contains aluminum, silicon and potassium as doping agents, and the purity of tungsten excluding cobalt is not less than 99.95% by mass. As described above, the doped tungsten (W31) contains aluminum, silicon and potassium as the doping agents, and the purity of tungsten is not less than 99.95% by mass.

It is apparent from FIG. 5 that the tungsten alloy containing 300 mass ppm or 500 mass ppm of cobalt has substantially the same tensile strength after the high temperature heat treatment or the tensile strength which lowers more gently in comparison with that of the doped tungsten (W31) not containing cobalt, but the tungsten alloy containing 700 mass ppm of cobalt has the tensile strength after the high temperature heat treatment dropped sharply in comparison with that of the doped tungsten (W31) not containing cobalt. Thus, it is seen that the cobalt content is preferably not more than 500 mass ppm.

The cobalt content is not necessarily restricted if it is not more than 500 mass ppm, but it is more preferably not less than 100 mass ppm but not more than 500 mass ppm, and most preferably not less than 200 mass ppm but not more than 400 mass ppm from the viewpoint of effectively suppressing the drop of the tensile strength after the high temperature heat treatment.

The matrix 1 in the probe needle material of the invention contains only one of rhenium and cobalt and may also contain both rhenium and cobalt. And, the matrix 1 may also contain another component or an inevitably mixed component if necessary and without departing from the content of the invention. Such a component may be one which is generally contained in it and its example is potassium, aluminum or silicon, which may be contained in about 100 ppm.

The probe needle of the invention is used in contact with an inspection object to inspect its electrical characteristics and provided with the probe needle material of the invention on at least the tip thereof. The probe needle of the invention has the above-described probe needle material of the invention on at least its tip, so that contact stability can be maintained for a long period and abrasion by polishing can also be reduced.

The probe card of the invention has its probe needle made of the probe needle of the invention. The probe card of the invention has the probe needle made of the above-described probe needle of the invention, so that the contact stability of the probe needle can be maintained for a long period and abrasion by polishing can also be reduced.

Figure 6:
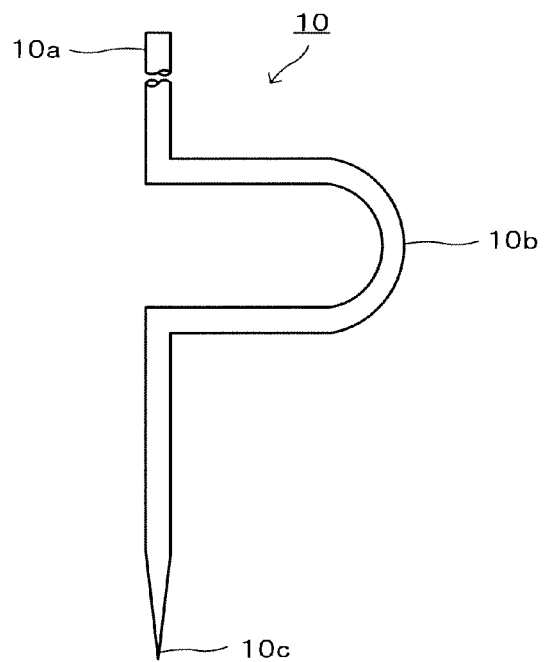
FIG. 6 is an appearance diagram showing an example of the probe needle of the invention.
Figure 7:
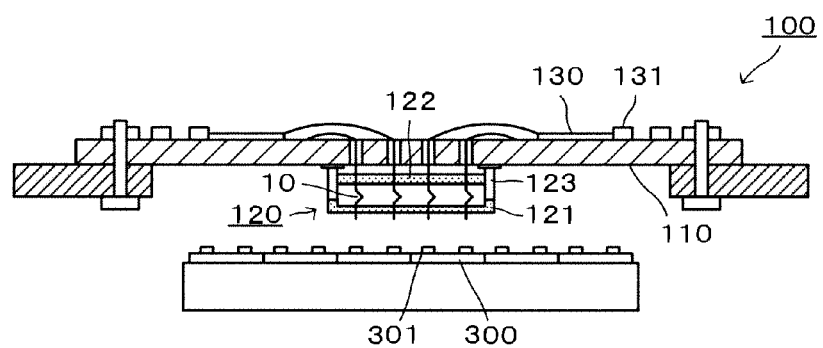
FIG. 7 is an appearance diagram showing an example of a probe card using the probe needle shown in FIG. 6.

FIG. 6 is an appearance diagram showing an example of the probe needle of the invention, and FIG. 7 is an appearance diagram showing an example of the probe card using the probe needle shown in FIG. 6. The probe needle 10 shown in FIG. 6 is a vertical operation type and has a base end portion 10a extended downward, a buckling portion 10b disposed below the base end portion 10a and having a laterally-facing and substantially U-shaped form, and a tip portion 10c which is disposed below the buckling portion 10b and forms the top of a substantially conical shape part configured to have a gradually reduced diameter downward. At least the tip portion 10c of the probe needle 10 is provided with the probe needle material of the invention.

The probe needle 10 is appropriate when it is provided with the probe needle material of the invention on at least the tip portion 10c. For example, the substantially conical shape part including the tip portion 10c may also be made of the probe needle material of the invention, and for example the whole body from the tip portion 10c to the base end portion 10a may be made of the probe needle material of the invention, and the portion configured of the probe needle material of the invention can be appropriately modified if necessary and without departing from the content of the invention.

The probe card 100 shown in FIG. 7 has a substrate 110 and a probe needle supporting portion 120 attached to the substrate 110. The substrate 110 is formed with a wiring pattern 130 which is connected with the probe needles 10, and the other end of the wiring pattern 130 is connected to substrate terminals 131. The probe needle supporting portion 120 has two parallel support plates 121, 122 for supporting the probe needles 10, and suspending members 123 for suspending the support plates 121, 122 from the bottom surface of the substrate 110. And, the probe needles 10 are arranged such that their buckling portions 10b each are positioned between the two support plates 121 and 122.

The inspection using the above probe card 100 is performed as shown in, for example, the same drawing by contacting the tip portions 10c of the probe needles 10 to electrodes 301 of a semiconductor integrated circuit 300 which is an inspection object arranged below the probe card 100. In the inspection process, the probe needles 10 provided with the probe needle material of the invention on at least the tip portions 10c can be used to maintain the contact stability of the probe needles 10 for a long period. And abrasion by polishing can be suppressed, and normal inspection can be performed for a long period.

Figure 8:
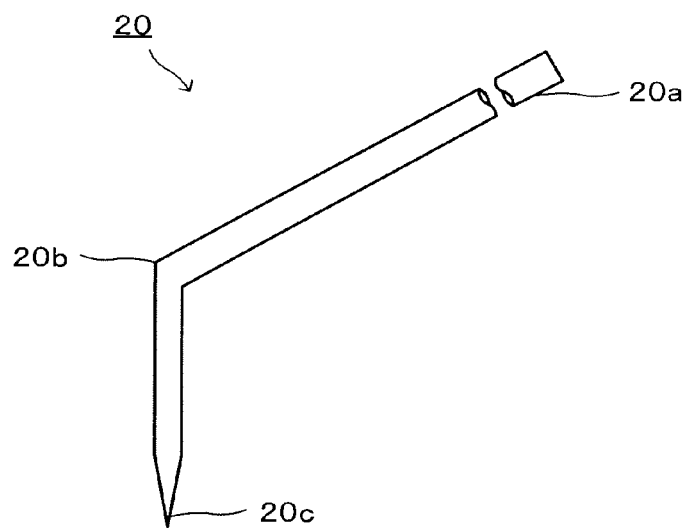
FIG. 8 is an appearance diagram showing another example of the probe needle of the invention.
Figure 9:
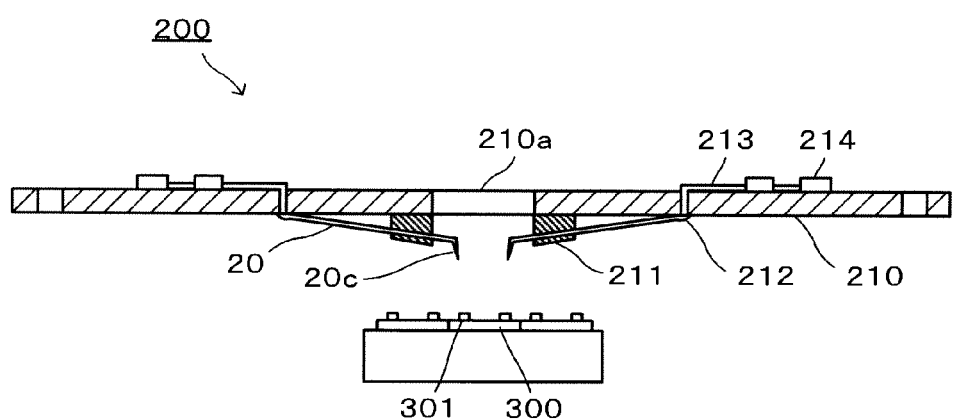
FIG. 9 is an appearance diagram showing an example of a probe card using the probe needle shown in FIG. 8.

The probe needle of the invention is not limited to the above-described vertical operation type but may be, for example, a cantilever type, a vertical spring contact type or the like. FIG. 8 is an appearance diagram showing an example of the cantilever type probe needle, and FIG. 9 is an appearance diagram showing an example of the probe card using the probe needle shown in FIG. 8. The probe needle 20 shown in FIG. 8 has a base end portion 20a extended obliquely downward, a bent portion 20b disposed at an end part below the base end portion 20a and bent downward, and a tip portion 20c which is disposed below the bent portion 20b and forms the top of a substantially conical shape part configured to have a diameter gradually reduced downward. This probe needle 20 is also provided with the probe needle material of the invention on at least the tip portion 20c.

The probe card 200 shown in FIG. 9 has a substrate 210 having an opening portion 210a at the center, a ring 211 made of an epoxy-based resin or the like and attached to the main surface on the bottom side of the substrate 210, and probe needles 20 supported by the inclined surface of the ring 211. The base end portion 20a of the probe needle 20 is connected to the lower end of a through hole 212 which is formed through the substrate 210, and the neighborhood of the tip portion 20c is fixed by the ring 211 disposed along the opening edge of the opening portion 210a. The top end of the through hole 212 is connected to a substrate terminal 214 through a wiring pattern 213 disposed on the substrate 210. The inspection using the above probe card 200 is also performed by contacting the tip portions 20c of the probe needles 20 to the electrodes 301 of the semiconductor integrated circuit 300 which is an inspection object arranged below the probe card 200.

A process of producing the probe needle material of the invention is described below.

For example, a tungsten powder and a hard-to-adhere compound powder are blended as the raw material mixture powder, and another raw material powder is blended if necessary, to prepare a tungsten alloy powder. At this time, a blending amount of the hard-to-adhere compound powder in the finally obtained probe needle material is adjusted such that the hard-to-adhere compound content becomes not less than 0.1% by volume but not more than 3.5% by volume. Specifically, a specific gravity is used to calculate the mass fraction from the volume percentage of the respective constituents in the finally obtained probe needle material, and the tungsten powder, the hard-to-adhere compound powder and another additive powder are blended according to the obtained mass fraction.

When the hard-to-adhere compound contained in the finally obtained probe needle material is an oxide such as $ZrO_2$ or $Cr_2O_3$, the tungsten alloy powder is prepared as the raw material mixture powder by blending a tungsten oxide powder and a metal powder of metal composing the above hard-to-adhere compound, and the tungsten oxide powder is reduced to oxidize the metal powder to obtain the metal oxide ($ZrO_2$, $Cr_2O_3$) as the hard-to-adhere compound. In such a case, for example, a mass fraction is calculated from the volume percentage of the respective constituents in the finally obtained probe needle material by using a specific gravity, and the tungsten oxide powder, the metal powder of metal composing the hard-to-adhere compound powder and another additive powder are blended according to the obtained mass fraction.

The raw material mixture powder obtained as described above is press molded and then undergone electric current sintering in a hydrogen atmosphere to obtain a sintered body as the probe needle material. And, sintering is performed at a high temperature of 1800° C. or above because tungsten has a high melting point. If a compound having a low melting point is contained, it is evaporated and scattered when the sintering is performed at a high temperature, and alloying might not be made. But all the hard-to-adhere compounds used in the invention can be alloyed sufficiently because they have a melting point of higher than 2000° C. as shown in Table 1.

The sintered body as the probe needle material is first formed into a wire material by appropriately combining plastic working such as stamping, drawing and rolling with anneal processing for crystal control and distortion removal. At this time, it is preferable to prepare the surface condition of the wire material by adjusting the surface roughness of a wire drawing die and a processing degree of electrolytic polishing performed if necessary.

The obtained wire material is undergone straight processing and then cut depending on a length of the probe needle to be obtained finally. It is preferable that the cut-off body is subjected to mechanical polishing such as centerless grinding to provide it with a smoother surface condition. In addition, the cut-off body is subjected to plating or the like if necessary and fabricated into a prescribed shape depending on a type such as a vertical operation type, a cantilever type or the like. And its tip portion is sharpened in a conical shape by etching or mechanical polishing to obtain the probe needles 10 and 20. The obtained probe needles 10 and 20 can be attached to the prescribed substrates 110 and 210 to obtain the probe cards 100 and 200.

EXAMPLES

The present invention is described more specifically by reference to Examples.

Examples 1 to 13

In Examples 1 to 10, a tungsten alloy powder as the raw material mixture powder was prepared by blending one type of compound powder selected from hard-to-adhere compound powders $TiB_2$, $ZrB_2$, $TaB_2$, $ZrC$, $ZrO_2$ and $Cr_2O_3$ and a tungsten powder such that the hard-to-adhere compound content in the finally obtained probe needle material became as shown in Table 2. It was then press molded under a pressure of 100 MPa and sintered at 2400° C. to provide a probe needle material.

In Example 11, the tungsten alloy powder as the raw material mixture powder was prepared by blending a $TiB_2$ powder, a $ZrB_2$ powder and a tungsten powder, such that $TiB_2$ and $ZrB_2$ contents each in the finally obtained probe needle material became 0.5% by volume and their total became 1% by volume. It was then press molded under a pressure of 100 MPa and sintered at 2400° C. to provide the probe needle material.

In Example 12, the tungsten alloy powder as the raw material mixture powder was prepared by blending a tungsten powder and a rhenium powder such that the rhenium powder became 3% by mass in the whole of them and blending the mixture powder of the tungsten powder and the rhenium powder with a $Cr_2O_3$ powder such that the $Cr_2O_3$ content in the finally obtained probe needle material became 1% by volume. It was then press molded under a pressure of 100 MPa and sintered at 2400° C. to provide the probe needle material. In Example 13, the tungsten alloy powder as the raw material mixture powder was prepared by blending a Co-containing solution instead of the rhenium powder of Example 11 so as to be 300 mass ppm and drying to prepare a mixture powder and then blending the $Cr_2O_3$ powder in the same manner as in Example 12. It was then press molded and sintered to provide the probe needle material.

In Examples 1 to 13, the tungsten powder used had an average particle diameter of 1.0 μm, the $TiB_2$, $ZrB_2$, $TaB_2$, ZrC, ZrO$_2$ and Cr$_2$O$_3$ powders used as the hard-to-adhere compounds had an average particle diameter of 1.0 µm, and the rhenium powder used had an average particle diameter of 3.5 µm. In Examples 1 to 13, the microscopic particles of the hard-to-adhere compound in the obtained probe needle material had an average particle diameter of 1.0 µm.

Comparative Examples 1 to 3

In Comparative Example 1, a tungsten alloy powder as the raw material mixture powder was prepared by blending a tungsten powder and a potassium-containing solution, such that the potassium content to the whole of them became 50 mass ppm after sintering, and drying, and then a probe needle material was provided by performing press molding and sintering in the same manner as in Examples 1 to 13. In Comparative Example 2, a tungsten alloy powder as the raw material mixture powder was prepared by blending a tungsten powder and a rhenium powder, such that the rhenium powder to the whole of them became 3% by mass, and then a probe needle material was provided by performing press molding and sintering in the same manner as in Examples 1 to 13. Both Comparative Examples 1 and 2 do not contain the hard-to-adhere compound powder.

In Comparative Example 3, a tungsten alloy powder as the raw material mixture powder was prepared by blending a Cr$_2$O$_3$ powder and a tungsten powder, such that the Cr$_2$O$_3$ content as the hard-to-adhere compound in the finally obtained probe needle material became 4% by volume, and then a probe needle material was provided by performing press molding and sintering in the same manner as in Examples 1 to 13.

namely whether disconnection or a crack does not occur, by performing a wire drawing process with the wire diameter varied to ϕ1.0 mm, ϕ0.5 mm or ϕ0.1 mm. The results are shown in Table 2. In Table 2, "O" in boxes below the wire drawing processability column indicates that disconnection or a crack did not occur during the wire drawing process and processing into a prescribed wire diameter could be made, and "X" indicates that disconnection or a crack occurred during the wire drawing process and processing into a prescribed wire diameter could not be made substantially.

Among the probe needle materials of Examples 1 to 13 and Comparative Examples 1 to 3, those evaluated as "O" when determined to have the wire diameter of ϕ0.1 mm in the evaluation of wire drawing processability were actually produced into probe needles and subjected to a wafer test to measure the number of contactable times (number of wafer contacts).

It was determined that each probe needle had a wire diameter of ϕ0.1 mm and a tip diameter of ϕ0.020 mm. For measurement, the probe needle and the Al—Cu electrode were contacted under a load of 2 g, an electric current of 30 mA was applied, and contact resistance was measured with an electric current of 1 mA. The above process was repeatedly performed. When the measured contact resistance exceeded 10Ω, the tip of the probe needle was polished with a #4000 polishing paper. Thus, contacting was repeated while polishing, and the measurement was terminated when the tip of the probe needle was abraded by 30 µm, and the number of contacted times so far was determined as the number of wafer contacts.

TABLE 2

| | Hard-to-adhere compound | | | Wire drawing processability | | | Wafer test Number of contact times |
|---|---|---|---|---|---|---|---|
| | Type | State | Matrix | ϕ1.0 mm | ϕ0.5 mm | ϕ0.1 mm | |
| Example 1 | 2 vol % TiB$_2$ | Dispersion strengthened | W | O | O | O | 1,034,855 |
| Example 2 | 2 vol % ZrB$_2$ | Dispersion strengthened | W | O | O | O | 1,083,764 |
| Example 3 | 2 vol % TaB$_2$ | Dispersion strengthened | W | O | O | O | 1,157,046 |
| Example 4 | 2 vol % ZrC | Dispersion strengthened | W | O | O | O | 1,208,473 |
| Example 5 | 2 vol % ZrO$_2$ | Dispersion strengthened | W | O | O | O | 1,188,297 |
| Example 6 | 0.1 vol % Cr$_2$O$_3$ | Dispersion strengthened | W | O | O | O | 629,041 |
| Example 7 | 0.5 vol % Cr$_2$O$_3$ | Dispersion strengthened | W | O | O | O | 702,475 |
| Example 8 | 1 vol % Cr$_2$O$_3$ | Dispersion strengthened | W | O | O | O | 832,254 |
| Example 9 | 2 vol % Cr$_2$O$_3$ | Dispersion strengthened | W | O | O | O | 981,753 |
| Example 10 | 3.5 vol % Cr$_2$O$_3$ | Dispersion strengthened | W | O | O | O | 1,018,853 |
| Example 11 | 0.5 vol % TiB$_2$ + 0.5 Vol % ZrB$_2$ | Dispersion strengthened | W | O | O | O | 892,438 |
| Example 12 | 1 vol % Cr$_2$O$_3$ | Dispersion strengthened | 3 mass % Re—W | O | O | O | 1,107,210 |
| Example 13 | 1 vol % Cr$_2$O$_3$ | Dispersion strengthened | 300 mass PPM Co—W | O | O | O | 1,035,937 |
| Comp. Exam. 1 | — | — | 50 mass PPM K—W | O | O | O | 453,892 |
| Comp. Exam. 2 | — | — | 3 mass % Re—W | O | O | O | 603,468 |
| Comp. Exam. 3 | 4 vol % Cr$_2$O$_3$ | Dispersion strengthened | W | O | X | X | — |

In Comparative Examples 1 to 3, the tungsten powder, the rhenium powder and the Cr$_2$O$_3$ powder as the hard-to-adhere compound powder had the same average particle diameter as in Examples 1 to 13. In Comparative Example 3, the microscopic particles of the hard-to-adhere compound in the obtained probe needle material had an average particle diameter of 1.0 µm.

The probe needle materials of Examples 1 to 13 and Comparative Examples 1 to 3 were evaluated for the wire drawing processability. The wire drawing processability was evaluated depending on whether the processing can be performed, It is apparent from Table 2 that the probe needle materials of Examples 1 to 13 containing a prescribed amount of the hard-to-adhere compound TiB$_2$, ZrB$_2$, TaB$_2$, ZrC, ZrO$_3$ or Cr$_2$O$_3$ can be made to have a large number of wafer contacts by an adhesion inhibiting action and a hardness improving action of the electrode material by the hard-to-adhere compound in comparison with a conventional probe needle material.

It is seen from the results of Examples 6 to 10 in which the content of the hard-to-adhere compound Cr$_2$O$_3$ is varied from 0.1% by volume to 3.5% by volume that the number of wafer contacts can be increased when the content of at least the hard-to-adhere compound is determined to be not less than 0.1% by volume, and the number of wafer contacts can be increased more when the content of the hard-to-adhere compound is determined to be not less than 0.5% by volume. In addition, it is seen from the result of Example 11 in which $TiB_2$ and $ZrB_2$ are contained that two or more kinds of hard-to-adhere compounds may be contained as the hard-to-adhere compound.

It is seen that the number of wafer contacts can be increased by increasing the content of the hard-to-adhere compound, but it is also apparent from the results of the probe needle material of Comparative Example 3 that when the content of the hard-to-adhere compound $Cr_2O_3$ is excessively increased to 4% by volume, disconnection or a crack tend to occur during the wire drawing process. Therefore, it is seen that the content of the hard-to-adhere compound is preferably not more than 3.5% by volume from the viewpoint of the wire drawing processability.

INDUSTRIAL APPLICABILITY

When the probe needle material according to the present invention is used for producing a probe needle, contact stability can be maintained for a long period, and abrasion by polishing can also be suppressed. And, the probe needle according to the invention can maintain the contact stability for a long period and can suppress the abrasion by polishing. The probe card according to the invention can maintain the contact stability of the probe needle for a long period and can also suppress the abrasion by polishing. And, the inspection process according to the invention can maintain the contact stability of the probe needle for a long period, can suppress the abrasion by polishing and can perform normal inspection for a long period.

What is claimed is:

1. A probe needle material used for producing a probe needle which is used in contact with an inspection object to inspect electrical characteristics of the inspection object, comprising,
a volume, wherein said volume is not less than 0.1% but not more than 3.5% of at least one compound selected from the group consisting of titanium boride, zirconium boride, hafnium boride, niobium boride, tantalum boride, chromium boride, titanium carbide, zirconium carbide, hafnium carbide, vanadium carbide, niobium carbide, tantalum carbide, zirconium oxide, hafnium oxide and chromium oxide and the balance of a tungsten alloy mainly consisting of tungsten; wherein the compound is in a particulate state and contained in a dispersed state in a matrix mainly consisting of tungsten in the tungsten alloy.

2. The probe needle material according to claim 1, wherein the matrix mainly consisting of tungsten contains not more than 44% by mass of rhenium.

3. The probe needle material according to claim 1, wherein the matrix mainly consisting of tungsten contains not more than 500 mass ppm of cobalt.

4. A probe needle used in contact with an inspection object to inspect electrical characteristics of the inspection object, wherein the probe needle material according to claim 1 is disposed on at least a tip portion of the probe needle.

5. A probe card, comprising a probe card body and a probe needle, used to inspect electrical characteristics of an inspection object by contacting the probe needle to the inspection object, wherein the probe needle is the probe needle according to claim 4.

6. An inspection process, comprising using a probe card having a probe card body and a probe needle and contacting the probe needle to an inspection object to inspect electrical characteristics of the inspection object, wherein the probe card according to claim 5 is used as the probe card.

* * * * *